United States Patent [19]

Cranford, Jr. et al.

[11] 4,429,237
[45] Jan. 31, 1984

[54] HIGH VOLTAGE ON CHIP FET DRIVER

[75] Inventors: Hayden C. Cranford, Jr., Apex; Charles R. Hoffman, Raleigh; Geoffrey B. Stephens, Cary, all of N.C.

[73] Assignee: International Business Machines Corp., Armonk, N.Y.

[21] Appl. No.: 245,802

[22] Filed: Mar. 20, 1981

[51] Int. Cl.³ .................... G03K 17/10; G03K 17/687
[52] U.S. Cl. .................... 307/450; 307/568; 307/581; 307/200 B; 357/23
[58] Field of Search .......... 357/52, 53, 23 HV, 23 D, 357/23 ME; 307/450, 242, 581, 297, 540, 568, 200 B

[56] References Cited

U.S. PATENT DOCUMENTS

| | | | |
|---|---|---|---|
| 3,454,844 | 7/1969 | Dill | 357/23 MG |
| 4,069,430 | 1/1978 | Masuda | 307/450 X |
| 4,172,260 | 10/1979 | Okabe et al. | 357/53 |
| 4,199,695 | 4/1980 | Cook et al. | 307/269 |
| 4,288,802 | 9/1981 | Ronen | 357/53 X |
| 4,307,307 | 12/1981 | Parekh | 307/568 X |
| 4,333,225 | 6/1982 | Yeh | 357/53 X |

FOREIGN PATENT DOCUMENTS 53-136489 11/1978 Japan ............................. 357/23 HV
2045525 10/1980 United Kingdom .......... 357/23 HV

OTHER PUBLICATIONS

Saraswat et al., "A High Voltage MOS Switch", *IEEE Journal of Solid-State Circuits*, Jun. 1979, pp. 136-142.
Hagiwara et al., "A 16K Bit Electrically Erasable PROM Using n-Channel Si-Gate MNOS Technology", *IEEE Journal of Solid-State Circuits*, vol. SC-15, No. 3, Jun. 1980.

Primary Examiner—Larry N. Anagnos
Assistant Examiner—David R. Hudspeth
Attorney, Agent, or Firm—Gerald R. Woods

[57] ABSTRACT

High voltage tolerant FET circuits are characterized by the use of shield structures surrounding source/drain diffusion pockets, with the shields tied to apropriate potentials, which in some cases is the associated gate potential. Some embodiments use enhancement mode devices which however have implanted channels underlying the shield structures. Operation of several embodiments is achieved near the snap-back limits by the use of a clamp to maintain potential drop below this limit. High voltage switching at heavy loads is achieved by a voltage divider providing appropriate gate potentials to the load carrying FETs.

14 Claims, 7 Drawing Figures

HIGH VOLTAGE ON CHIP FET DRIVER

FIELD OF THE INVENTION

The present invention relates to integrated semiconductor circuitry, and more particularly, field effect transistor circuitry (hereinafter FET) which is capable of switching relatively high (24 volts or higher) voltages by overcoming diffusion breakdown, snap-back sustaining voltage and hot electron injection into oxide insulators all as a result of high voltages.

BACKGROUND OF THE INVENTION

The increasing application of integrated circuits, and particularly FET devices has necessarily resulted in striking compromises between antithetical considerations. Of prime importance is the optimization of logic circuit density and speed, and typically optimizing device geometry based on these criteria necessarily require sacrifices to be made in respect of other parameters, one particular parameter being breakdown voltage. However, some applications are now being uncovered in which the reduced breakdown voltage of FET devices has proved an impediment. One typical example is electrically alterable read only storage (EAROS). It has been found that to program and erase the storage array it is necessary to selectively route high voltages to particular nodes in the array. The relative term "high" should be taken in the context of all FET devices, particularly devices optimized for increased density and speed. For devices manufactured in this type of technology 15 volts can be considered a "high" voltage, and without question 20–25 volts is certainly a "high" voltage.

Solutions which increase the device voltage are rendered relatively unacceptable if the processing employed to implement those solutions is at odds with the implementation of associated circuitry, thus requiring, for example, separate or off-chip devices. Thus, a solution to the high breakdown voltage problem should be compatible with the basic FET technology and thereby allow fabrication on the same chip, of relatively high speed, tightly packed circuits along with those circuits capable of tolerating relatively high voltages.

Typical FET devices include a semi-conductor substrate of one conductivity type with two diffused areas of another conductivity type separated by a channel. The channel may or may not, also contain an impurity implant, depending on whether the device is an enhancement or depletion mode device. An insulated gate overlies the channel and the voltage applied to the gate may be used to regulate the current flowing in the channel. In integrated circuit technology, devices (which in discrete logic technology are connected by a conductor) may actually share a common diffused region. One limiting factor in the voltage handling capability of FET devices is P-N junction breakdown caused by an increased electric field in the curved region near the junction edge. It is known in the prior art that such breakdown characteristics can be controlled (within a limited range), see for example, "Physics and Technology of Semiconductor Devices" by A. F. Grove, chapter 10, Wiley, N.Y., 1967. This limited control is effected by providing other gates, gate-like structures or shields which can be arranged to alter the local electric field.

However, a second problem which must be addressed in switching high voltages is the snap-back—sustaining voltage. An FET device exhibits this effect when the drain voltage is clamped relative to the source in response to excessive current loads on a drain junction which is biased near, but below avalanche breakdown. In a device which exhibits snap-back, the gate loses control and current can increase without any further increase in voltage. The prior art illustrates that relief or increase in the sustaining voltage can be obtained by increasing the effective channel length, or decreasing the channel width, but this control is limited.

A still further problem with switching high voltages in FET's is caused by charge being injected into the oxide, under the gate. More particularly, at sufficiently high fields, caused by excessive voltages, hot electrons are injected into the oxide insulator resulting in trapped charge which causes changes in device parameters.

It is therefore, one object of the present invention to provide a circuit capable of tolerating "high" voltages employing FETs. It is another object of the present invention to provide such a circuit in which the FET geometry and parameters do not require changes in the basic process so that the high voltage circuits of the invention can be incorporated in the same chip along with other conventional FET circuits. It is still a further object of the invention to provide such an FET circuit for switching high voltages which exhibits effective control over P-N junction breakdown, avoids sustaining voltages, and is not subject to hot electron injection. These and other objects of the invention will become apparent as this description proceeds.

SUMMARY OF THE INVENTION

The invention provides a family of high voltage FET circuits which are compatible with processes used to fabricate conventional FET circuits and which therefore, allows the high voltage circuits to be incorporated in the same chip with other conventional FET circuits. In accordance with one aspect of the invention, a high voltage FET circuit comprises a pair of FETs connected in series between a potential source, and a reference potential. One of the FETs has a input terminal connected to its gate; both of the FETs include a shield surrounding at least a drain or source diffusion wherein the gate of one of the FETs is connected to the shield structure of another FET. The one FET whose gate is connected to the shield structure of the other, has its own shield structure connected to a potential which is substantially the same as the potential source, and indeed, may well be that potential source. This aspect of the invention provides an FET inverter tolerant of relatively high voltages comprising:

a first depletion mode FET with drain and source terminals, a gate and gate terminal, and drain and source shields, said drain shield connected to a source of potential substantially equal to said potential source, a second enhancement mode FET with drain and source terminals, said second FET drain terminal connected to said source terminal of said first FET, said second FET having a drain shield connected to a source shield of said first FET and to a gate of said first FET, and providing an output terminal connected thereto, said second FET having a channel between said sources and drain with a depletion mode channel adjacent said drain shield.

said second FET having a gate terminal coupled to an input terminal, and a source terminal coupled to a reference potential;

whereby said output terminal changes in potential level between a first low level and a second high level as said input terminal is subjected to input voltages of various levels.

A device in accordance with this aspect of the invention can tolerate a first range of potentials in a switching function, but can tolerate a larger range of potential in a non-switching application.

The range of available switching voltages is extended in accordance with another aspect of the invention which employs a pair of series-connected depletion mode FETs, each with drain and source shield structures tied to the associated gate, and in series a pair of enhancement mode FETs, at least one of which having a drain shield tied to the associated gate which has a fixed reference potential lying between a potential source which is connected to the drain of one of the depletion mode FETs, and another potential which is connected to the source terminal of the fourth FET. The circuit's input circuit is the gate of the fourth FET. Potential PN junction breakdown is avoided in the two depletion mode devices by providing a shield surrounding each source or drain area coupled electrically to the associated gate. By providing two (or more) depletion devices and tying the associated gate to the source potential, the PN junction voltage is limited to less than the breakdown voltage.

The reference potential on the gate of a first enhancement device protects the associated drain junction via a drain shield which is also coupled to the gate. Accordingly, the arrangement can reliably switch 15 volts at the output terminal which is connected to the common node which is the source of one depletion device and the drain of one enhancement device. Note that in this embodiment of the invention all source/drain shields are tied to the associated gate, thus avoiding a potential difference between gate and shield which, if excessive, can cause hot electron emission and raises the possibility of charge trapping.

In accordance with still another aspect of the invention, a yet further increase (to 20-25 volts) in voltage switching capability is achieved by adding, to the above-described circuit a clamping circuit connected to the common source/drain of two of the depletion devices. The clamp maintains this node at no less than a fixed potential which is arranged to prevent PN junction breakdowns and avoid snapback effect by ensuring the source/drain voltage of the depletion devices is less than the snapback/sustaining breakdown voltage. In a specific aspect of the invention the clamping circuit comprises still another FET with a drain connected to a reference potential at which the aforementioned node is to be maintained (also connected to the device gate) with the FET source connected to the node, and also connected to a source/shield structure which overlies an ion implanted portion of the channel thereby providing depletion function. Hot electron injection which might otherwise be a problem in the clamping FET is avoided since on conduction the gate and shield are at substantially common potential, and when a potential difference exists the device is cut off.

Finally, in still another aspect of the invention the same (e.g. 20-25 volt switching capacity) is provided along with the ability to drive substantial quantities of current. In accordance with this aspect of the invention the aforementioned node is employed as one terminal of a voltage divider, and the source/drain node at the depletion/enhancement interface (coupled to the depletion device gate) is employed as another terminal in a voltage divider; and these voltage divider outputs are coupled to gates of two series connected additional FETs. These two additional FETs are connected in series between the potential source and an output terminal, and may have their parameters adjusted (for example, by increasing their channel width) to provide substantial current handling capability. For additional breakdown potential protection one of these series connected FETs (with a relatively lower potential on its gate) can be an enhancement device with a depletion implant to increase P-N junction breakdown voltage.

BRIEF DESCRIPTION OF THE DRAWINGS

The particulars of the invention will now be described in connection with several embodiments which are particularly described in the following portions of this specification when taken in conjunction with the attached drawings in which like reference characters identify identical apparatus, and in which.

DETAILED DESCRIPTION OF PREFERRED EMBODIMENTS

Figure 1A:
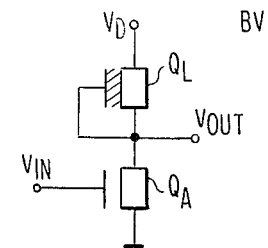
FIG. 1A is a schematic of a prior art FET inverter.

FIG. 1A is a schematic of a prior art inverter which is useful to point out one of the problems to be overcome.

FIG. 1A illustrates a prior art inverter comprising two series connected FETS $Q_L$, a depletion mode FET, with a drain terminal connected to a potential source $V_D$, with its source connected to the drain of an enhancement mode FET $Q_A$, whose source is connected to ground. An input terminal is connected to the gate of $Q_A$ and the output terminal is connected to the gate of $Q_L$, which is connected to a node common to the source of $Q_L$ and the drain of $Q_A$. In normal operation a high input voltage will bias $Q_A$ into conduction and the output terminal is at a low level. This presents a potential P-N junction breakdown condition at the drain of $Q_L$. On the other hand, when the input is at a low level the output terminal is substantially at the reference potential and this presents a potential P-N junction breakdown problem at the drain of $Q_A$.

Figure 1B:
FIG. 1B is a plot of FET P-N junction breakdown voltage as a function of gate voltage.
Figure 2A:
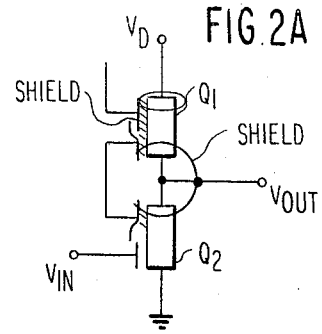
FIGS. 2A, 3, 4 and 5 are schematics of various embodiments of the invention.
Figure 2B:
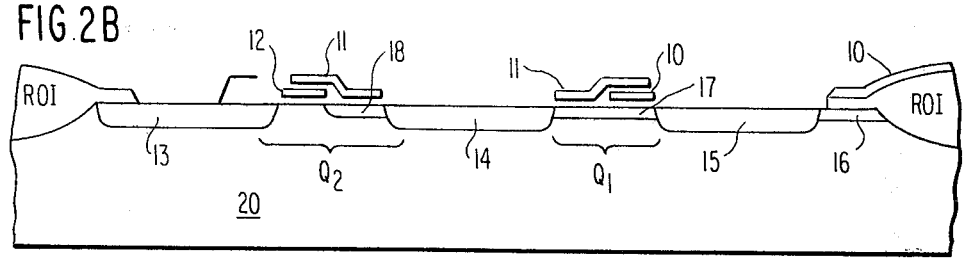
FIG. 2B is an end view of the embodiment of FIG. 2A.

FIG. 1B illustrates a curve of P-N junction breakdown voltage ($BV_{P-N}$) versus gate voltage, and indicates that at zero gate potential the breakdown voltage is reduced from that of a positive gate bias. FIGS. 2A and 2B are respectively, a schematic of one embodiment of the invention, and an end view of an integrated device corresponding thereto.

Referring first to FIG. 2A, a pair of series connected FETs Q1 and Q2 are connected between a source potential $V_D$ and another potential, for example ground. An output is taken at the terminal common to the source of Q1 and drain of Q2. An input terminal is connected to the gate of Q2 and the gate of Q1 is connected to a Q1 source shield conductor which is identical in potential to the Q2 drain shield, and labeled SHIELD in FIG. 2A. A drain shield for Q1 (also labeled SHIELD) is connected to a potential source which may be substantially equal to $V_D$, or it may be that potential. An end view of the geometry of the device which implements the circuit of FIG. 2A is shown in FIG. 2B. As shown there FETs Q1 and Q2 are implemented via N+ diffused regions 13-15 in a P− substrate 20. The drain of Q1, 15 is separated from the source of Q1, 14 by the channel, and the implanted channel 17 identifies Q1 as a depletion device. Q1 includes a gate 11, and in addition, via a double polysilicon process, electrode 10 or shield completely surrounds the drain diffusion 15.

Likewise, FET Q2 is implemented via a drain diffusion 14, a source diffusion 13 and a channel, in the region separating them. FET Q2 includes a gate 12 and, via the same double polysilicon process, Q2 has a second gate-like structure or shield 11 which is actually integral with the gate 11 comprising the gate of Q1. The shield 11, like the shield 10, completely surrounds the diffusion pocket 14 which is the source of Q1 and the drain of Q2. Note also, that the channel of Q2 includes an implanted region 18, for reasons which will be explained; so that the channel of Q2, an otherwise enhancement device exhibits depletion characteristics over a portion of the channel.

Returning now to FIG. 2A note that when the input voltage to the gate of Q2 is in a low voltage state and therefore V out is at a relatively high level, the drain of Q2 and the source of Q1 have an effective gate bias which raises the breakdown potential in accordance with the curve shown in FIG. 1B. In a similar fashion, the shield associated with the drain of Q1, which is at or near the potential $V_D$ performs the same function for the drain of Q1. Accordingly, the susceptibility to P-N junction breakdown has been decreased, or in other words, the voltage switching capability of the circuit has been increased. Note also, under the circumstances mentioned above, that the Q2 channel is in part a depletion channel and this is significant when the input is up, in order to maintain a conductive channel from V out to the source of Q2. Were the Q2 channel completely an enhancement channel then the output terminal would be limited to a lower limit of one enhancement threshold above ground.

Also significant is the fact that since the diffusion shield is electrically tied to a potential which is substantially equal to the diffusion it is protecting, the electrical field across the thin oxide separating the shield and the diffusion is substantially zero. Thus, high field stress on this thin oxide is avoided.

While the circuit of FIG. 2A, and the geometry of FIG. 2B, significantly increase the voltage switching ability for the inverter, two other problems limit this capability. The first such problem is the snap-back effect in which, for diffusions subjected to relatively large current loads, if biased in the region of snap-back/sustaining breakdown, can cause clamping action to occur wherein the gate loses control of the current. In addition, the overlapping gates, or gate/shield, if subjected to substantially different potentials may result in charge being injected into the oxide between the gate and shield. For sufficiently high fields hot electrons can be injected into the oxide insulator resulting in trapped charges causing threshold voltage shifts and transconductance changes, i.e., altering the parameters of the device.

It should be apparent that in the design of a circuit whose schematic is shown in FIG. 2A three different conditions must be reviewed to ensure that the circuit is not subject to a voltage or current caused failure. Those different circumstances include the two different static conditions under which the circuit operates, i.e., with a low input potential or a high input potential, and the dynamic case when the circuit is transiting from one static condition to the other. In some circuits, and the circuit whose schematic as shown in FIG. 2A is one example, the dynamic condition is limiting, that is the circuit is capable of handling a higher voltage $V_D$ under static circumstances than under dynamic circumstances. Accordingly, the circuit of FIG. 2A is also useful, over and above its use as a switch, for providing a voltage reference at the output terminal in response to an input potential which may, rather than being digital, be analog in that it may take on a potential anywhere within a continuous range.

Figure 3:
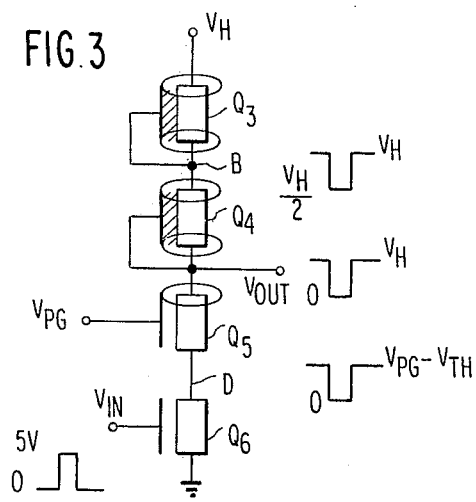

To provide an increase in the voltage switching capability, the schematic of FIG. 3 is employed.

FIG. 3 shows another aspect of the invention in which Q1 and Q2 of FIG. 2A are each replaced by a pair of FETs. As shown in FIG. 3 two series connected depletion FETs Q3 and Q4 are connected between a potential source $V_H$ (where $V_H$ can be higher than $V_D$) and an output terminal, with the node common to the source of Q3 and the drain of Q4 denoted B for convenience. Serially connected between the output terminal and ground are two series connected enhancement FETs Q5 and Q6, with node D comprising the source of Q5 and drain of Q6. The gate of Q5 is connected to a reference $V_{PG}$, and the gate of Q6 is the input terminal. The gates of Q3 and Q4 are tied respectively to node B and the output terminal. In addition, the source and drain of FETs Q3 and Q4, as well as the drain of Q5 have protecting shields completely surrounding the diffusion pocket and coupled electrically to the associated gate. The geometry of the cross-section of a device to implement the circuit of FIG. 3 should be apparent from the preceding description and is therefore not illustrated.

In order to handle the increased potential drop between the potential source $V_H$ and the output terminal, the geometry of the FETs Q3 and Q4 is arranged such that when the output terminal is driven low the voltage $V_H$ will evenly divide between devices Q3 and Q4. This can be effected in a manner well known to those skilled in the art by suitably selecting the length and the width of the channel in Q3 and Q4. Since the gate of Q3 is tied to node B, which by choice, is about $V_H/2$, the drain of Q3 is subjected to a gated P-N breakdown with gate potential of approximately $V_H/2$. The source of Q3 has a shield at about the same potential as the diffusion pocket, whereas the drain of Q4 is also subjected to a potential of about $V_H/2$, different from that on the associated shield. $V_H$ is selected so that $V_H/2$ is less than the breakdown voltage, and thus $V_H$ for conventional FET technology can be as high as 20-25 volts.

On the other hand, when the input signal is down, then the output terminal is at approximately $V_H$. However, under these circumstances each of the shields is at the same potential as is the pocket it surrounds thus protecting these pockets from breakdown.

Under the same circumstances, i.e., of low level input, $V_{PG}$ is selected so that node D held at $V_{PG}$-$V_{TH}$ (where $V_{TH}$ is the threshold voltage of Q5). By selecting $V_{PG}$, approximately halfway between the potential that has to be dropped across Q5 and Q6, the drain of Q5 (at $V_H$) is protected by the shield (at $V_{PG}$). For example, if $V_H$ is about 15 volts, then $V_{PG}$ can be in the range 8–9 volts, and successfully protect the drain diffusion of Q5 from voltage breakdown. With voltages in this range, then the node D, will be approximately 7–8 volts, well within the capability of the device Q6. Although FIG. 3 shows two depletion mode FETs Q3 and Q4 it should be apparent that more than two devices could be used. This is true too with respect to the schematic of FIGS. 4 and 5, as well.

Note that in connection with FIG. 3 that the overlapping gate, or gate/shield of FIG. 2A is not present. Accordingly, problems caused by hot electrons being trapped in the oxide between the gate/shield are not present. It should also be noted that the circuit of FIG. 3 can handle maximum $V_H$ when the devices Q3 and Q4 equally share the potential $V_H$. Unfortunately, because of process and device parameter variations there is a range of potentials the node B can assume with a high input potential. As this tolerance increases, of course, the possibility of breakdown being exhibited in either Q3 or Q4 becomes greater. In order to increase the switching capability, given these parameter variations, the circuit of FIG. 3 is varied by clamping node B, as is shown in FIG. 4.

Figure 4:
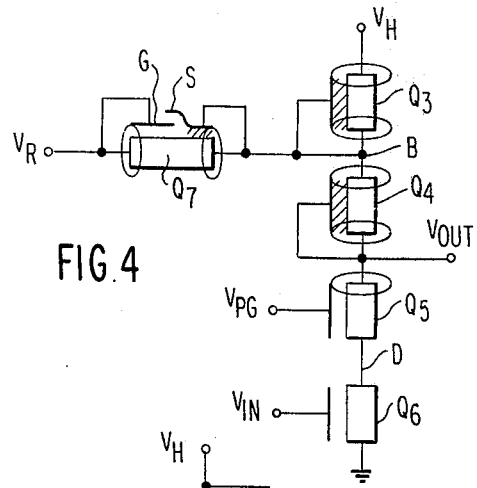

One embodiment of this aspect of the invention has a schematic as shown in FIG. 4 wherein the clamp comprises FET Q7 with drain connected to $V_R$ and source connected to node B. The FET is similar to Q2 (FIG. 2A) in that the gate of Q7 overlies an enhancement channel which is connected to the drain, but protecting shield S overlies a portion of the channel including an ion implant, so that the portion of the channel below the shield exhibits depletion characteristics, and the shield is also tied to node B. By appropriately selecting $V_R$, node B is clamped at this potential. For example, $V_R$, could be selected to be one half of $V_H$. Under those circumstances, when the output voltage is low, node B is clamped at approximately $V_H/2$. Since the clamping action of Q7 will not prevent node B from going higher, the parameters of FETs Q3 and Q4 are selected so that, in the absence of the clamp, the greater portion of the voltage drop across Q3/Q4 would appear across Q3; in other words without the clamping action of Q7 node B would be otherwise below $V_R$. This arrangement assures that node B is held up by the clamping action Q7 and thus effectively controls the voltage division between Q3 and Q4. When the output potential is low, i.e., when voltage is being dropped across Q3 and Q4, then the clamp is on or conducting, there is essentially no potential difference between the gate and shield and thus, the probability of electron trapping in the oxide between them is minimal. On the other hand, when the output potential is high, then there is a substantial potential difference between the gate and shield G and S, then the clamp Q7 is not conducting and thus the absence of current flow avoids problems which could be caused by electron trapping in the oxide. The circuit whose schematic as shown in FIG. 4 can be otherwise similar to the circuit of FIG. 3 with one further exception. Recall that $V_{PG}$ was selected, in connection with FIG. 3, to control the division of voltage across Q5 and Q6 when the output terminal was high. This is still the case in the device whose schematic is shown in FIG. 4, except that, now that as $V_H$ is raised, the potential on $V_{PG}$ may also have to be raised to ensure that breakdown voltages in Q5 or Q6 are avoided.

Those skilled in the art should understand that while the schematic of FIG. 4 illustrated a clamp embodied as an FET, that is not essential to the invention and other clamping means may be employed such as a diode or other circuits which may even be external to the chip.

The device whose schematic is shown in FIG. 4 operates quite effectively at up to about 20–25 volts, using conventional technology which is otherwise limited to about 10 to 12 volts but is limited in the amount of current that can be driven through the output terminal, especially because the parameters Q3–Q6 are selected based on voltage considerations. Therefore, in those cases when it is desired to switch high voltages and also drive relatively high levels of current load, the device whose schematic is shown in FIG. 4 is modified as shown in FIG. 5.

Figure 5:
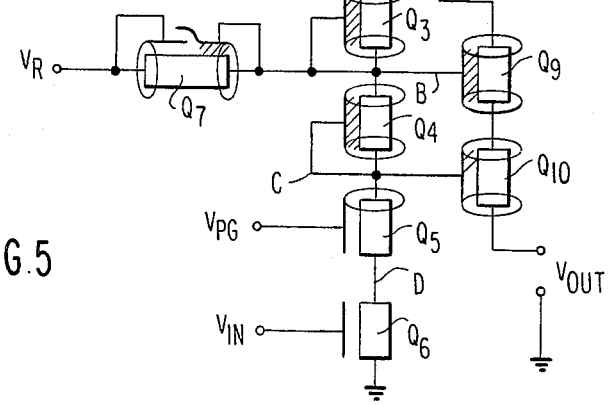

FIG. 5 shows a relatively high voltage capability switching circuit with the additional capability of driving relatively large loads which in many respect, is similar to the device whose schematic is shown in FIG. 4. Added to the device whose schematic is shown in FIG. 4 are two additional FETs, Q9 and Q10 connected in series between $V_H$ and the output terminal. Q9 is a depletion mode device which has shields protecting source and drain diffusion connected to its gate and its gate is connected to node B. Q10 is essentially an enhancement mode FET with protect shields around the drain and source diffusion connected to its gate, and its gate is connected to node C, the source of Q4 and Drain of Q5. With the device as shown in FIG. 5 when the output terminal is at the high voltage level, the gate drive is approximately $V_H$, and thus the current capability of Q9 and Q10 is greater than would be the current drive capability of Q3 and Q4 since their gate/source voltages is zero. While the FET Q10 has been described as an enhancement mode device, its channel has a portion near the drain with an ion implant; this has the effect of increasing its P-N junction breakdown voltage.

In the low output voltage state, FETs Q5 and Q6 must be arranged so that they have the capability of sinking enough current to pull down the output terminal; under those circumstances node B is clamped, as has been mentioned above at $V_R$, and the gate of Q10 is approximately at ground potential. Thus, whereas FETs Q3 and Q4 might have a channel width of two to two and one half microns, FETs Q5 and Q6 could be as wide as needed and relatively long, for example, 9–10 microns, FETs Q3 and Q4 are, as was explained in connection with FIGS. 3 and 4, approximately 1:1 devices in length to width ratio.

The device whose schematic is shown in FIG. 5 can be viewed as a controllable circuit for connecting the potential $V_H$ to the output terminal via FET devices Q9 and Q10. To provide gate drive for the devices a voltage divider comprising Q3 and Q4 can connect the gates of Q9 and Q10 to appropriate potentials, for example approximately $V_H/2$ and zero respectively in response to a high input signal. The input signal (which typically assumes a low or high logic level) is applied to a control circuit comprising the FETs Q5 and Q6. To ensure effective performance the clamp Q7 enables the potential of node B to be controlled. Since the function of Q3 and Q4 is merely voltage division, they and clamp Q7 could be replaced by polysilicon or external resistors, or other appropriate voltage dropping impedance. Because of present day process considerations, however, the preferred schematic is illustrated in FIG. 5.

The device as schematically shown in FIG. 5 exhibits the capability of driving relatively large quantities of current with $V_H$ of 20–25 volts. The circuit avoids P-N junction breakdown voltages by the judicious use of diffusion shields held at appropriate potentials, overcomes snap-back sustaining voltage limitations by minimizing the voltage drop required of any device when it is carrying current, avoids the problem of device characteristic variations caused by electron trapping as a result of potential differences between overlapping gate structures, and is capable of operating near breakdown limits in spite of process variations, especially through the use of the clamp at node B.

While specific embodiments of the invention have been described, this was for illustrative purposes only and the scope of the invention is to be construed in accordance with the claims appended hereto. Many changes will occur to those skilled in the art from a reading of the specification which changes are within the scope of the invention. As has been mentioned, for example, the number of FETs in FIGS. 3-5 can be increased beyond the specific devices shown. Under such circumstances it may be advisable to control other nodes in the same fashion that node B is controlled, although, of course, not at the same voltage.

What is claimed is:

1. An FET inverter comprising
a pair of series connected FET's, each with drain, source and gate terminals, an input terminal connected to a gate terminal of one of said FET's and an output terminal connected to a node common to drain of said one FET and source of said other FET,
said one FET having a shield surrounding its drain and overlying a portion of a channel between source and drain comprising a depletion channel,
said other FET having shields surrounding both source and drain, said source shield connected in common to said output terminal and said drain shield of said one FET, said drain shield of said other FET coupled to a potential substantially equal to a potential coupled to said other FET drain terminal.

2. The inverter of claim 1 wherein said other FET comprises a depletion mode FET.

3. A high voltage switching FET inverter comprising a plurality of FET's each with source, drain and gate, and terminals connected thereto all connected in series between first and second potentials with potential difference $V_H$, an input terminal coupled to an input FET gate terminal and an output terminal connected to a node common to a source terminal of one and drain terminal of another of said FET's,
a first group of said FET's comprising depletion mode FET's connected between a first of said potentials and said output terminal, each of said FET's in said first group having shields surrounding source and drains and electrically connected to the associated gate electrode,
a second group of said FET's comprising enhancement mode FET's connected between the second potential and said output terminal, a one FET in said second group having said input gate terminal, a second FET in said second group having a gate terminal connected to a potential intermediate said first and second potentials, said second FET having a drain shield electrically connected to the associated gate terminal.

4. The device of claim 3 wherein said first group FET's have nominally identical parameters.

5. The device of claim 3 which further includes clamping means connected to a clamped node common to a source of one and drain of another FET of said first group.

6. The device of claim 5 in which said clamping means comprises a further FET with drain, source and gate and electrodes connected thereto, said drain and gate of said further FET connected to a clamping potential and said source connected to said clamped common node.

7. The device of claim 5 or 6 in which parameters of said first group FETs are selected to ensure that, in the absence of said clamping means, said common node potential is no higher than said clamping potential.

8. The device of claim 7 in which said clamping potential is approximately one half $V_H$ and said first group consists of two FETs.

9. The device of claim 6 in which said further FET has a source shield electrically connected to said source.

10. The device of claim 8 which further includes a plurality of series connected current driving FETs connected between a first of said potentials and an output node, each with source, drain and gate, source and drain shields, and electrically connected terminals, source and drain shields electrically connected to associated gates, a gate terminal of one of said current driving FETs connected to said clamped node and a gate terminal of another of said current driving FETs connected to said output terminal.

11. A logic circuit for selectively connecting a high voltage source to an output terminal as a function of an input signal comprising:
a plurality of series connected FET devices connected between the high voltage source and said output terminal, each of said FET devices including an integral gate/shield overlying source and drain P-N junctions,
voltage division means connected in parallel with the series connection of said plurality of series connected FET devices and said output terminal for selectively applying appropriate potentials to gate terminals of said FET devices, said means including an impedance connecting said high voltage source to a gate terminal of a first of said plurality and another impedance for each other FET device in said plurality,
and control circuit means for selectively connecting the gate terminal of one of said plurality of FET devices to a reference voltage source, said control circuit means comprising: a first FET device with source terminal connected to said reference voltage source and gate terminal connected to an input voltage source,
a second FET device with source terminal connected to drain terminal of said first FET device, drain terminal connected to the gate terminal of one of said plurality of FET devices and gate terminal connected to a voltage source intermediate said high and reference voltage sources, said second FET device including an integral gate/shield overlying said drain P-N junction.

12. The device of claim 11 in which said voltage division means comprises a plurality of FETs equal in number to said plurality of series connected FET devices, each of said plurality of FETs comprising source, drain and gate with terminals connected thereto, each including an integral gate/shield overlying source and drain P-N junctions with each source terminal of said plurality of FETs connected to its respective gate terminal and to a different gate terminal of said plurality of FET devices.

13. The device of claim 12 which further includes clamping means for controlling the potential of at least one node in said voltage division means.

14. The device of claim 13 in which said clamping means comprises:
a further FET device with drain connected to a clamping potential and source connected to said controlled node, said further FET device having a shield overlying a source P-N junction and electrically connected to said controlled node.

* * * * *